US012696757B2

(12) United States Patent
Dutta et al.

(10) Patent No.: US 12,696,757 B2
(45) Date of Patent: Jul. 28, 2026

(54) ANTIFUSE AND RESISTOR

(71) Applicant: INTERNATIONAL BUSINESS MACHINES CORPORATION, Armonk, NY (US)

(72) Inventors: Ashim Dutta, Clifton Park, NY (US); Chih-Chao Yang, Glenmont, NY (US); Kishan Jayanand, Cohoes, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 418 days.

(21) Appl. No.: 18/470,472

(22) Filed: Sep. 20, 2023

(65) Prior Publication Data

US 2025/0096125 A1 Mar. 20, 2025

(51) Int. Cl.
*H10W 20/49* (2026.01)

(52) U.S. Cl.
CPC .................................. *H10W 20/491* (2026.01)

(58) Field of Classification Search
CPC ........................ H01L 23/5252; H01L 23/5256
See application file for complete search history.

(56) References Cited

U.S. PATENT DOCUMENTS

| | | | |
|---|---|---|---|
| 5,300,456 A | * | 4/1994 | Tigelaar .............. H01L 23/5252 257/50 |
| 5,485,138 A | | 1/1996 | Morris |
| 5,565,702 A | * | 10/1996 | Tamura .............. H01L 23/5252 257/50 |
| 5,789,795 A | | 8/1998 | Sanchez |
| 6,083,785 A | | 7/2000 | Segawa |
| 6,124,194 A | | 9/2000 | Shao |
| 6,207,560 B1 | | 3/2001 | Lee |
| 6,232,042 B1 | | 5/2001 | Dunn |
| 6,251,710 B1 | | 6/2001 | Radens |
| 6,335,228 B1 | | 1/2002 | Fuller |
| 6,633,055 B2 | | 10/2003 | Bertin |
| 8,742,457 B2 | | 6/2014 | Yang |
| 9,343,404 B2 | | 5/2016 | Lee |
| 10,008,507 B2 | * | 6/2018 | Adusumilli .......... H10D 64/017 |
| 11,239,160 B2 | | 2/2022 | Zhou |
| 2001/0055839 A1 | * | 12/2001 | Lehr ................... H01L 23/5252 438/131 |
| 2004/0027234 A1 | | 2/2004 | Hashimoto |
| 2021/0233843 A1 | * | 7/2021 | Yang ................ H01L 21/76886 |

* cited by examiner

*Primary Examiner* — Syed I Gheyas
(74) *Attorney, Agent, or Firm* — L. Jeffrey Kelly

(57) ABSTRACT

A horizontal antifuse structure including a fuse dielectric layer, two slanted annular metal structures arranged adjacent to and opposite one another, wherein bottom portions of the two slanted annular metal structures are embedded in the fuse dielectric layer.

20 Claims, 5 Drawing Sheets

100

100

SECTION A

200

200

200

204

206

206

206

206

208

202

200

204

206

206

206

206

208

202

204

ANTIFUSE AND RESISTOR

BACKGROUND

The present invention generally relates to semiconductor structures, and more particularly to antifuse structures.

Integrated circuit processing can be generally divided into front end of the line (FEOL), middle of the line (MOL) and back end of the line (BEOL) processes. The FEOL and MOL processing will generally form many layers of logical and functional devices. By way of example, the typical FEOL processes include wafer preparation, isolation, well formation, gate patterning, spacer, extension and source/drain implantation, silicide formation, and dual stress liner formation. The MOL is mainly gate contact formation. Layers of interconnections are formed above these logical and functional layers during the BEOL processing to complete the integrated circuit structure. As such, BEOL processing generally involves the formation of insulators and conductive wiring. The industry has typically used copper as the conductive metal for the interconnect structures most often using a dual damascene process to form a metal line/via interconnect structure.

A fuse is a structure that is normally "on" meaning that current is flowing, but once "programmed" it is "off" meaning that current does not flow. In a fuse, programming means applying a suitable voltage so that the fuse "blows" to create an open circuit or high resistance state. An antifuse is a structure that is normally "off" meaning that no current flows, but once "programmed" it is "on" meaning that current does flow. In an antifuse, programming means applying a suitable voltage to two electrodes and forming a conductive link between them to close the circuit.

In integrated circuitry memory devices, fuses and antifuses can be used for activating redundancy in memory chips and for programming functions and codes in logic chips. Specifically, dynamic random access memory (DRAM) and static random access memory (SRAM) may use fuses and antifuses for such purposes. In addition, fuses and antifuses can also be used to prevent decreased chip yield caused by random defects generated in the manufacturing process. Moreover, fuses and anti-fuses provide for future customization of a standardized chip design. For example, fuses and anti-fuses may provide for a variety of voltage options, packaging pin out options, or any other options desired by the manufacturer to be employed prior to the final processing. These customization possibilities make it easier to use one basic design for several different end products and help increase chip yield.

SUMMARY

According to an embodiment of the present invention, an antifuse structure is provided. The antifuse structure may include a fuse dielectric layer, and two slanted annular metal structures arranged adjacent to and opposite one another, where bottom portions of the two slanted annular metal structures are embedded in the fuse dielectric layer.

According to another embodiment of the present invention, an antifuse structure is provided. The antifuse structure may include a fuse dielectric layer, a top dielectric layer directly on the fuse dielectric layer, and two slanted annular metal structures arranged adjacent to and opposite one another, where only bottom portions of the two slanted annular metal structures are embedded in the fuse dielectric layer.

According to another embodiment of the present invention, an antifuse structure is provided. The antifuse structure may include a fuse dielectric layer, a top dielectric layer directly on the fuse dielectric layer, and two slanted annular metal structures arranged adjacent to and opposite one another, where only bottom portions of the two slanted annular metal structures are embedded in the fuse dielectric layer, where each of the two slanted annular metal structures comprises a metal liner surrounding a bottom and sides of an inner core.

BRIEF DESCRIPTION OF THE DRAWINGS

The following detailed description, given by way of example and not intended to limit the invention solely thereto, will best be appreciated in conjunction with the accompanying drawings, in which.

Figure 1:
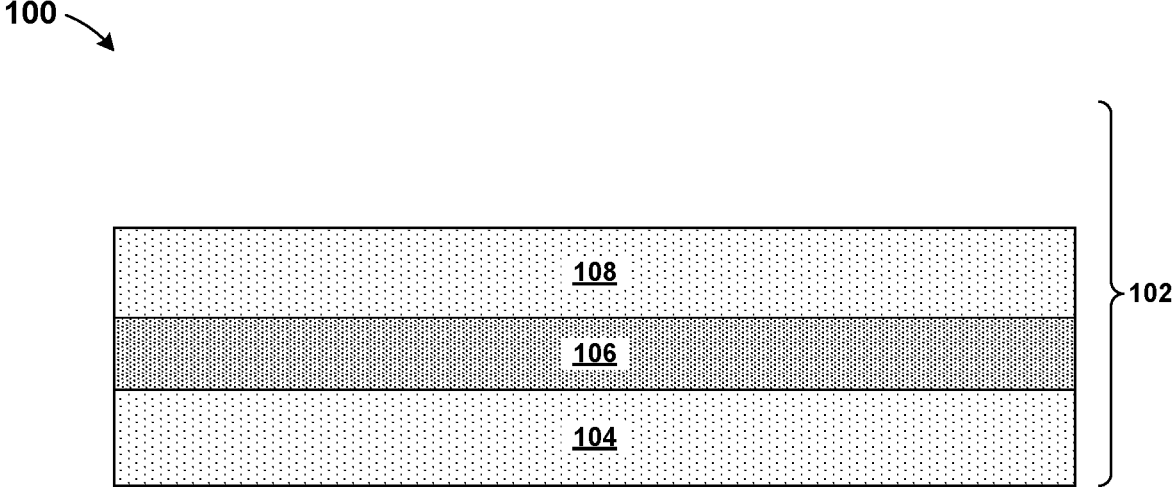
FIG. 1 illustrates a cross-sectional view of the semiconductor structure during an intermediate step of a method of fabricating an interconnect structure according to an exemplary embodiment.

The drawings are not necessarily to scale. The drawings are merely schematic representations, not intended to portray specific parameters of the invention. For clarity and ease of illustration, scale of elements may be exaggerated. The drawings are intended to depict only typical embodiments of the invention. In the drawings, like numbering represents like elements.

DETAILED DESCRIPTION

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. In the description, details of well-known features and techniques may be omitted to avoid unnecessarily obscuring the presented embodiments.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper", "lower", "right", "left", "vertical", "horizontal", "top", "bottom", and derivatives thereof shall relate to the disclosed structures and methods, as oriented in the drawing figures. It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Also, the term "sub-lithographic" may refer to a dimension or size less than current dimensions achievable by photolithographic processes, and the term "lithographic" may refer to a dimension or size equal to or greater than current dimensions achievable by photolithographic processes. The sub-lithographic and lithographic dimensions may be determined by a person of ordinary skill in the art at the time the application is filed.

The terms substantially, substantially similar, about, or any other term denoting functionally equivalent similarities refer to instances in which the difference in length, height, or orientation convey no practical difference between the definite recitation (e.g. the phrase sans the substantially similar term), and the substantially similar variations. In one embodiment, substantial (and its derivatives) denote a difference by a generally accepted engineering or manufacturing tolerance for similar devices, up to, for example, 10% deviation in value or 10° deviation in angle.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

Antifuses become difficult to fabricate when interconnect dimensions scale down. Some antifuse structures can be fabricated by placing metal islands between metal wires embedded in a dielectric material. Other antifuse structures can be fabricated by placing a relatively high resistance metal between metal wires. Such antifuse structures are difficult to fabricate as the spacing between the metal wires becomes sub-15 nm. Additionally, antifuses are typically relatively bulky and take up a valuable space in an integrated circuit design. Further, bulky antifuse structures reduce the amount of available space for more important interconnect structures, for example, metal wires, and other circuit components in the circuit.

The present invention generally relates to semiconductor structures, and more particularly to antifuse structures. More specifically, the antifuse structures disclosed herein include two slanted annular metal structures embedded in a fuse dielectric layer and programming the antifuse structures forms an electrical connection between the slanted annular metal structures. Exemplary embodiments of the antifuse structures are described in detail below by referring to the accompanying drawings in FIGS. 1 to 6. Those skilled in the art will readily appreciate that the detailed description given herein with respect to these figures is for explanatory purposes as the invention extends beyond these limited embodiments.

Referring now to FIG. 1 a demonstrative illustration of a structure 100 is shown during an intermediate step of a method of fabricating an antifuse structure according to an embodiment of the invention.

The structure 100 may include one or more back-end-of-line metallization levels, and more specifically, a metallization level 102. According to at least one embodiment, the metallization level 102 may include a via level or a metal level, as both are well known to persons having ordinary skill in the art. Although the metallization levels disclosed herein would typically be part of the back-end-of-line, embodiments of the present invention explicitly contemplate other locations and arrangements, such as, for example, middle-of-line, wafer backside, wafer frontside, or other known metallization regions. In all cases, the antifuse structure described herein, and represented by the structure 100, will be integral to the electrical wiring system of a final device or package.

According to at least one embodiment, the metallization level 102 is a typical back-end-of-line level and includes a network of conductive lines or vias embedded in a dielectric layer. The network of conductive lines or vias form the "wiring" or electrical connections to underlying transistors and devices (not shown). The conductive lines may alternatively be referred to as metal lines, traces, or metal traces.

According to embodiments of the present invention, the metallization level 102 includes a first dielectric layer 104, a fuse dielectric layer 106 and a second dielectric layer 108 stacked in order one on top of the other, as illustrated.

The first dielectric layer 104 and the second dielectric layer 108 may each be made from suitable interlevel dielectric materials such as silicon based low-k dielectrics, or porous dielectrics. For example, the first or second dielectric layer may be made from organic polymer low-k dielectrics and SiCOH-based low-k dielectrics (such as SiCOH, SiCNOH). For purposes of the present description, the second dielectric layer 108 is the same, or substantially similar, as the first dielectric layer 104. In an alternate embodiment, the second dielectric layer 108 is a different material than the first dielectric layer 104.

The fuse dielectric layer 106 is sandwiched between the first dielectric layer 104 and the second dielectric layer 108, as illustrated. It is critical to the present invention that the fuse dielectric layer 106 is different than either the first dielectric layer 104 or the second dielectric layer 108. More specifically, the fuse dielectric layer 106 is a dielectric material carefully selected for its dielectric breakdown properties. For example, according to embodiments of the present invention, the fuse dielectric layer 106 has a dielectric breakdown voltage less than the surrounding dielectrics; however, such is not necessary. Alternatively, the fuse dielectric layer 106 can be chosen based on maximum allowed programming voltage to be used to initiate breakdown. Low dielectric breakdown voltage will help lowering programming voltage.

Dielectric breakdown is the failure of an insulating material to prevent the flow of current under an applied electrical stress. The breakdown voltage is the voltage at which the failure occurs, and the material is no longer electrically insulating.

Figure 2:
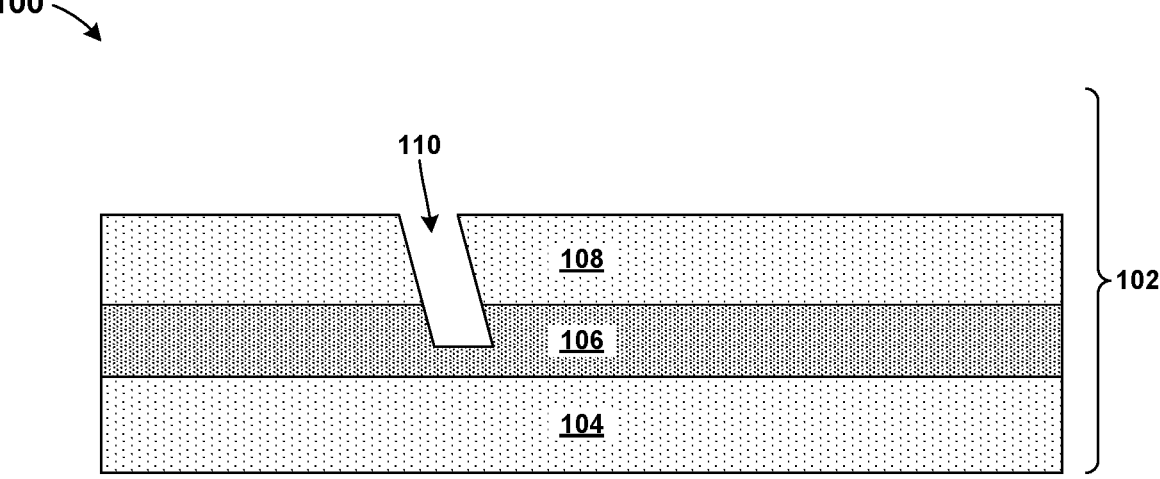
FIG. 2 illustrates a cross-sectional view of the semiconductor structure after forming a first trench by removing first portions of the second dielectric layer and the fuse dielectric layer according to an exemplary embodiment.

Referring now to FIG. 2, the structure 100 is shown after forming a first trench 110 by removing first portions of the second dielectric layer 108 and the fuse dielectric layer 106 in accordance with an embodiment of the present invention.

An etching technique is applied to generally remove portions of the second dielectric layer 108 and the fuse dielectric layer 106, and form the first trench 110 according to known techniques. Specifically, a first mask (not shown) is formed directly on top of the second dielectric layer 108, and exposed portions of the second dielectric layer 108 and the fuse dielectric layer 106 are removed selective to the first mask using a directional etching technique. The object of this directional etching technique is to form the first trench 110 at a first angle relative to horizontal surfaces of the structure 100. More specifically, the directional etching technique is applied at a very specific angle to create the first trench 110 at a very specific positive angle relative to horizontal surfaces of the structure 100, as illustrated.

According to embodiments of the present invention, the first angle of the first trench 110 may range from approximately 30 degrees to approximately 60 degrees. In all cases, etching continues until at least a portion of the fuse dielectric layer 106 is removed and a bottom of the first trench 110 lands somewhere in the middle of the fuse dielectric layer 106, as illustrated. As such, etching must stop before exposing the first dielectric layer 104.

Suitable directional etching techniques may include: reactive ion etching (RIE) or ion beam etching. In an embodiment, ion beam etching is used to create the first trench 110 where directional ion sputtering is the main mechanism of etching. In an alternative embodiment, an ion beam etching technique using, for example, at fixed ion beam angle corresponding to the desired angle of the first trench 110 is used. In yet another embodiment, a RIE chamber using, for example, inert gas ion species, is used to create the first trench 110. In all cases, no wafer or ion beam rotation should be applied, and the ion direction shall be chosen and tailored to the specific dielectric materials of the second dielectric layer 108 and the fuse dielectric layer 106 in order to produce the desired trench profile. Additionally, laser ablation or chemical etching cannot produce this structure as they are more isotropic in nature.

Figure 3:
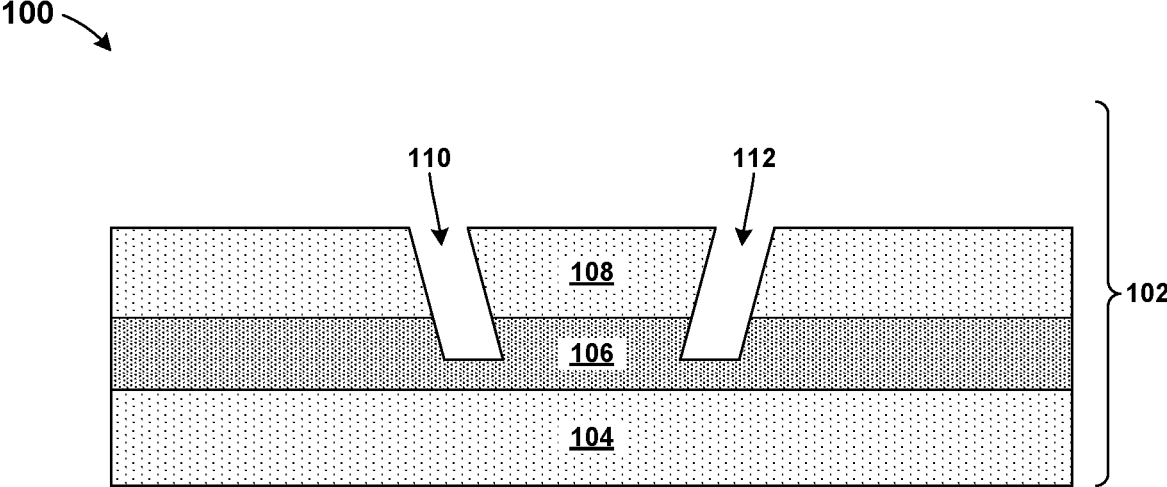
FIG. 3 illustrates a cross-sectional view of the semiconductor structure after forming a second trench by removing second portions of the second dielectric layer and the fuse dielectric layer according to an exemplary embodiment.

Referring now to FIG. 3, the structure 100 is shown after forming a second trench 112 by removing second portions of the second dielectric layer 108 and the fuse dielectric layer 106 in accordance with an embodiment of the present invention.

An etching technique is applied to generally remove portions of the second dielectric layer 108 and the fuse dielectric layer 106, and form the second trench 112 according to known techniques. Specifically, a second mask (not shown) is formed directly on top of the second dielectric layer 108, and exposed portions of the second dielectric layer 108 and the fuse dielectric layer 106 are removed selective to the second mask using a directional etching technique. The object of this directional etching technique is to form the second trench 112 at a second angle relative to horizontal surfaces of the structure 100. More specifically, the directional etching technique is applied at a very specific angle to create the second trench 112 at a very specific negative angle relative to horizontal surfaces of the structure 100, as illustrated.

According to embodiments of the present invention, the second angle of the second trench 112 may range from approximately −30 degrees to approximately −60 degrees. In all cases, etching continues until at least a portion of the fuse dielectric layer 106 is removed and a bottom of the second trench 112 lands somewhere in the middle of the fuse dielectric layer 106, as illustrated. As such, etching must stop before exposing the first dielectric layer 104. Suitable directional etching techniques, as described above with respect to forming the first trench 110, may be used to similarly create the second trench 112.

Figure 4:
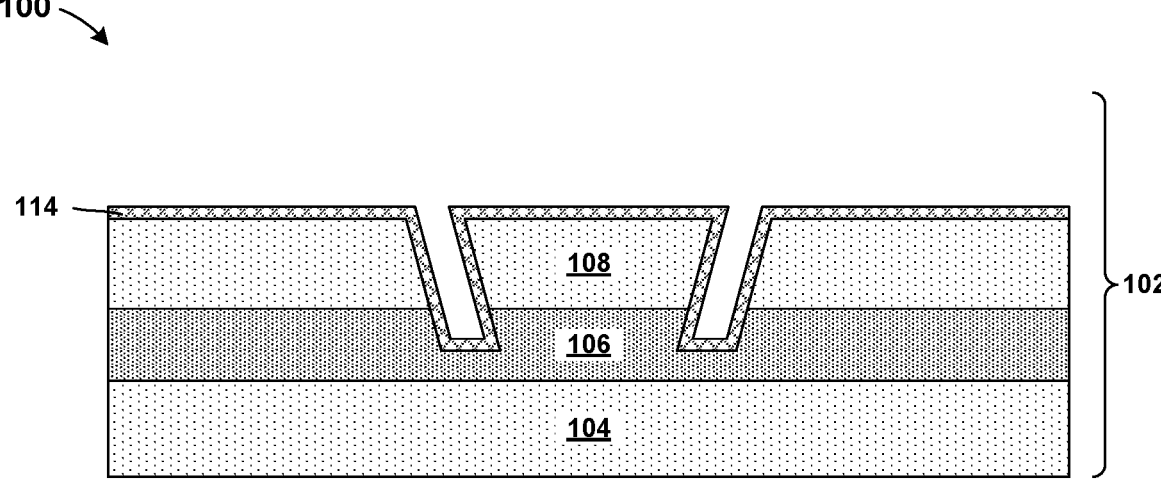
FIG. 4 illustrates a cross-sectional view of the semiconductor structure after forming a conductive layer according to an exemplary embodiment.

Referring now to FIG. 4, the structure 100 is shown after forming a conductive layer 114 in accordance with an embodiment of the present invention.

The conductive layer 114 is conformally deposited on exposed surfaces of the structure 100 according to known techniques. As used herein, "conformal" means that a material layer has a continuous thickness, or substantially continuous thickness. For example, a continuous thickness generally means a first thickness as measured from a bottom surface to a topmost surface that is the same as a second thickness as measured from an inner sidewall surface to an outer sidewall surface.

According to embodiments of the present invention, the conductive layer 114 may include any suitable conductive material capable of conducting sufficient current of any typical semiconductor circuit having an antifuse structure. In an embodiment, the conductive layer 114 may include copper, tantalum nitride, titanium nitride, tungsten nitride, or some combination thereof. In at least one embodiment, the conductive layer 114 may have a thickness, ranging from about 5 nm to about 50 nm. Typically, the conductive layer 114 may include a single layer; however, in other embodiments, it may include multiple layers of different conductive materials.

Figure 5:
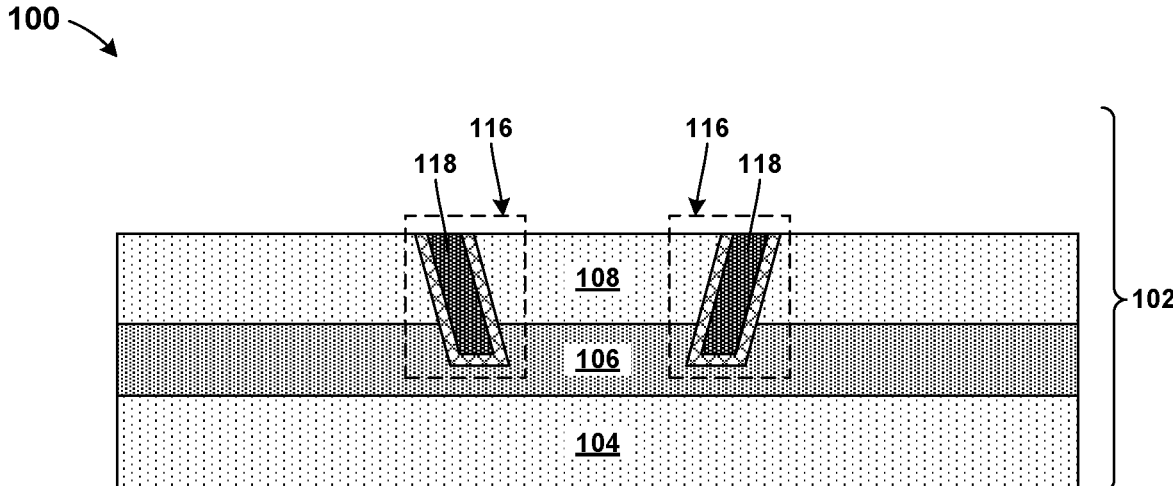
FIG. 5 illustrates a cross-sectional view of the semiconductor structure after removing portions of the conductive layer according to an exemplary embodiment.

Referring now to FIG. 5, the structure 100 is shown after removing portions of the conductive layer 114 in accordance with an embodiment of the present invention.

A third dielectric layer 118 is deposited directly on the conductive layer 114 and fills the first trench 110 and the second trench 112 according to known techniques. After deposition, a planarization technique such as, for example, chemical mechanical planarization (CMP) and/or grinding is applied to remove excess conductive material of the conductive layer 114 and excess dielectric material of the third dielectric layer 118 from top surfaces of the structure 100 according to known techniques. After polishing uppermost surfaces of the conductive layer 114 and uppermost surfaces of the third dielectric layer 118 are both flush, or substantially flush, with an uppermost surface of the second dielectric layer 108, as illustrated.

Like the other dielectric layers, the third dielectric layer 118 may be made from suitable interlevel dielectric material such as silicon based low-k dielectrics, or porous dielectrics. For example, the third dielectric layer 118 may be made from organic polymer low-k dielectrics and SiCOH-based low-k dielectrics (such as SiCOH, SiCNOH). For purposes of the present description, the third dielectric layer 118 is the same, or substantially similar, as the second dielectric layer 108. In an alternate embodiment, the third dielectric layer 118 is a different material than the second dielectric layer 108.

The remaining portions of the conductive layer 114 and the third dielectric layer 118 create two slanted annular metal structures 116, as illustrated. Each of the two slanted annular metal structures 116 includes an inner core made from the third dielectric layer 118 and an outer shell or metal liner made from the conductive layer 114. The outer shell surrounds all sides and a bottom of the inner core. According to embodiments of the present embodiment, the two slanted annular metal structures 116 are embedded in the second dielectric layer 108 and the fuse dielectric layer 106. More specifically, bottommost portions of the two slanted annular metal structures 116 are embedded in the fuse dielectric layer 106, as illustrated. Additionally, due to the positive angle of the first trench 110 and the negative angle of the second trench 112, bottoms of the two slanted annular metal structures 116 are closer together than the tops. According to at least one embodiment, the two slanted annular metal structures 116 have a pillar shape with a cross section resembling a circle or a square. In another embodiment, the two slanted annular metal structures 116 have an elongated slot shape with a cross section similar to an ellipse or a rectangle.

Figure 6:
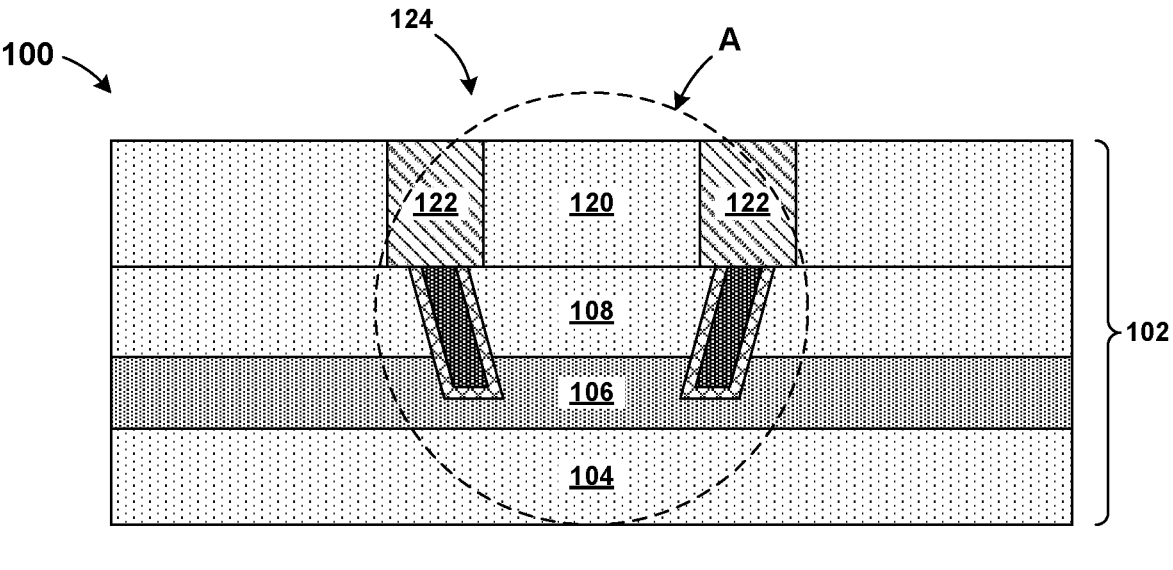
FIG. 6 illustrates a cross-sectional view of the semiconductor structure after forming a fourth dielectric layer and fuse contacts according to an exemplary embodiment.

Referring now to FIG. 6, the structure 100 is shown after forming a fourth dielectric layer 120 and fuse contacts 122 in accordance with an embodiment of the present invention.

The fourth dielectric layer 120 is blanket deposited directly on exposed surfaces of the structure 100 according to known techniques. For purposes of the present description, the fourth dielectric layer 120 is the same, or substantially similar, as the second dielectric layer 108 and the third dielectric layer 118, previously described. In an alternate embodiment, the fourth dielectric layer 120 is a different material than the second dielectric layer 108, the third dielectric layer 118, or both.

Next, the fuse contacts 122 are formed in the fourth dielectric layer 120 according to known techniques. For example, according to typical damascene techniques, a trench is formed in the fourth dielectric layer 120 and then subsequently filled with a conductive material thereby forming the fuse contacts 122. According to disclosed embodiments, the fuse contacts 122 can be a metal line or via.

After deposition, a planarization technique such as, for example, chemical mechanical planarization (CMP) and/or grinding is applied to remove excess material according to known techniques. After polishing topmost surfaces of the fourth dielectric layer 120 are flush, or substantially flush, with a topmost surface of the fuse contacts 122, as illustrated.

Finally, for purposes of the present description the two slanted annular metal structures 116, the fuse dielectric layer 106, and the fuse contacts 122 together form an antifuse structure 124.

With continued reference to FIG. 6, embodiments disclosed herein explicitly contemplate multiple antifuse structures 124 despite only a single antifuse structure being illustrated and described herein.

Figure 6A:
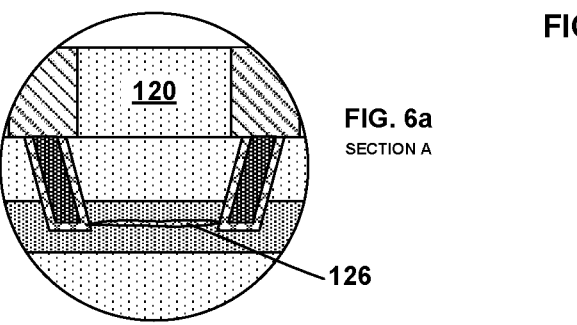
FIG. 6a illustrates a cross-sectional view of the semiconductor structure after programming the antifuse structure according to an exemplary embodiment.
Figure 7:
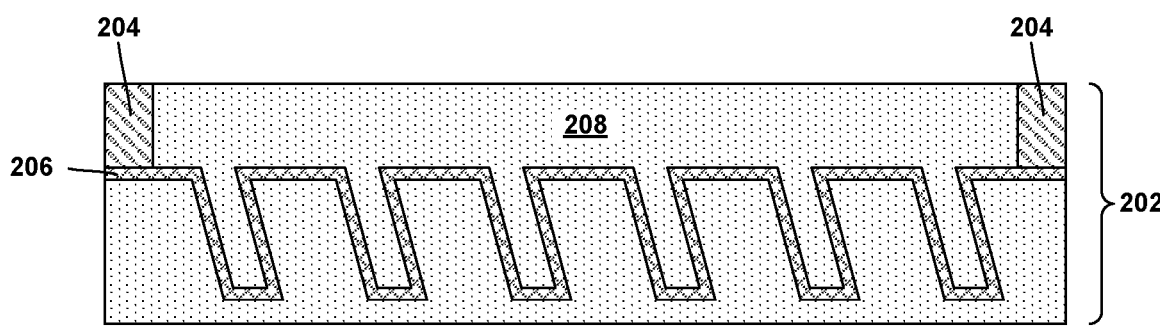
FIGS. 7, 8, 9, and 10 illustrate cross-sectional views of a semiconductor structure during an intermediate step of a method of fabricating a resistor structure according to an exemplary embodiment.
Figure 8:
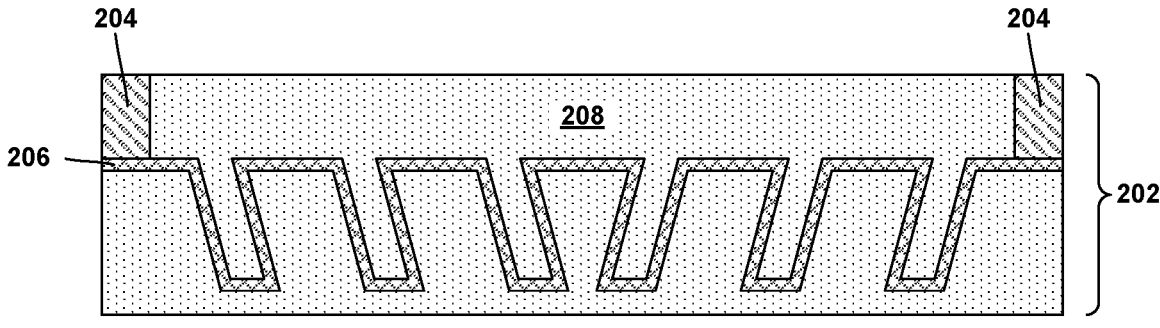

Referring now to FIG. 6a, the structure 100 is shown after programming the antifuse structure 124 in accordance with an embodiment of the present invention.

The relatively small distance between the two slanted annular metal structures 116, coupled with the existence of the fuse dielectric layer 106 together create a "weak point" prone to dielectric breakdown. More specifically, dielectric breakdown during fuse programing creates a conductive link 126 between the two slanted annular metal structures 116, as illustrated. The antifuse structure 124 can be programmed by applying a programming voltage to one of the two slanted annular metal structures 116 and grounding the other. In the context of the present invention, either the programming voltage or the ground may be applied to either of the two slanted annular metal structures 116, and vice versa. According to the illustrated embodiment, the programming voltage and/or the ground may be applied to either of the two slanted annular metal structures 116 via either of the fuse contacts 122. Persons having ordinary skill in the art understand the structure 100 disclosed herein will be part of a larger integrated circuit and include additional metal layers, wiring, traces, vias which may also be involved in programming.

The programming voltage, which should be equal to or greater than the breakdown voltage of the fuse dielectric layer 106 may range from about 1 V to about 10 V, and have a current ranging from about 2 mA to about 10 mA. As a result, the fuse dielectric layer 106 no longer serves as an insulator, and conductive paths, for example the conductive link 126, are created within the fuse dielectric layer 106 between the two slanted annular metal structures 116, as illustrated.

Although not critical, the conductive link 126 may have a thickness ranging from about 1 nm to about 10 nm and ranges there between. The length of the conductive link 126 is equal to a distance between bottom portions of the two slanted annular metal structures 116 measured within the fuse dielectric layer 106. Both the breakdown distance and the fuse dielectric layer 106 will affect how much programming voltage is required and how long it takes to program the antifuse structure 124 and form the conductive link 126.

Further, although only a single conductive link 126 is depicted in the figures, programming may result in multiple conductive links 126 of varying shapes and sizes. Additionally, the one or more conductive links 126 may form anywhere along the edge of the outer shell of each of the two slanted annular metal structures 116.

As illustrated in FIGS. 6 and 6a, the antifuse structure 124 has some distinctive and notable features. For example, the antifuse structure 124 has a smaller footprint than typical antifuse structures and can thus be implemented in higher density arrangements. Additionally, the fuse-area, or region where the conductive link 126 forms, is relatively small and very localized which offers increased programming control with lower programing voltages.

It is further noted that the two slanted annular metal structures 116 of the antifuse structure 124 are positioned at approximately equal, but opposite, angles relative to horizontal surfaces of the structure 100. Said differently, one of the two slanted annular metal structures 116 is at a specific positive angle relative to horizontal surfaces of the structure 100 corresponding to the first angle of the first trench 110 (FIG. 2), and the other one of the two slanted annular metal structures 116 is at a specific negative angle relative to horizontal surfaces of the structure 100 corresponding to the second angle of the second trench 112 (FIG. 3).

As such, the space or distance between the two slanted annular metal structures 116 increases from a bottom of the structures to a top of the structures. Said differently, bottoms of the structures are space apart a first distance, and tops of the structures are spaced apart a second distance, where the first distance is less than the second distance.

As it relates to the antifuse structure 124, the first distance is equal to the breakdown distance. The difference between the first distance and the second distance is critical to the operation and fabrication of the antifuse structure 124. Specifically, the first distance is minimized to precisely control the breakdown distance and thus control programming, while the second distance is maximized to allow for adequate spacing for the formation of the fuse contacts 122. If the two slanted annular metal structures 116 were not angled, the spacing between them would be controlled or limited by a pitch of the fuse contacts 122 resulting in a relatively large breakdown distance requiring increased programming voltage.

As previously indicated above, programming of the antifuse structure 124 is caused by the dielectric breakdown of the fuse dielectric layer 106, and the dielectric material chosen for the fuse dielectric layer 106 is at least partly responsible for programming behavior of the antifuse structure 124. Even further, the dielectric breakdown depends on defectivity, and the more area creates more defectivity and causes dielectric breakdown sooner.

With continued reference to FIGS. 6 and 6a, according to an embodiment the antifuse structures represented by the structure 100 include a fuse dielectric layer, and two slanted annular metal structures arranged adjacent to and opposite one another, where bottom portions of the two slanted annular metal structures are embedded in the fuse dielectric layer.

With continued reference to FIGS. 6 and 6a, according to an embodiment the antifuse structures represented by the structure 100 further include a first fuse contact above and directly contacting a top surface of one of the two slanted annular metal structures, and a second fuse contact above and directly contacting a top surface of the other of the two slanted annular metal structures.

With continued reference to FIGS. 6 and 6a, each of the two slanted annular metal structures are each arranged at opposite angles relative to a surface of the fuse dielectric layer.

With continued reference to FIGS. 6 and 6a, each of the two slanted annular metal structures comprises an inner core and an outer shell.

With continued reference to FIGS. 6 and 6a, each of the two slanted annular metal structures comprises an inner core and an outer shell, where the inner core comprises a portion of the fuse dielectric layer, and where the outer shell comprises a metal layer.

With continued reference to FIGS. 6 and 6a, a first lateral distance between the two slanted annular metal structures measured at a bottom of the two slanted annular metal structures is less than a second lateral distance between the two slanted annular metal structures measured at a top of the two slanted annular metal structures.

With continued reference to FIGS. 6 and 6a, according to an embodiment the antifuse structures represented by the structure 100 further include a conductive link in direct contact with and extending between bottoms of the two slanted annular metal structures through the fuse dielectric layer.

With continued reference to FIGS. 6 and 6a, according to an embodiment the antifuse structures represented by the structure 100 include a fuse dielectric layer, a top dielectric layer directly on the fuse dielectric layer, and two slanted annular metal structures arranged adjacent to and opposite one another, where only bottom portions of the two slanted annular metal structures are embedded in the fuse dielectric layer.

With continued reference to FIGS. 6 and 6a, according to an embodiment the antifuse structures represented by the structure 100 include a fuse dielectric layer, a top dielectric layer directly on the fuse dielectric layer, and two slanted annular metal structures arranged adjacent to and opposite one another, where only bottom portions of the two slanted annular metal structures are embedded in the fuse dielectric layer, where each of the two slanted annular metal structures comprises a metal liner surrounding a bottom and sides of an inner core.

Turning now to an alternative discussion on resistors. Resistors become difficult to fabricate when interconnect dimensions scale down as they require a certain length to achieve desired resistance for a given resistive material. Some resistor structures can be fabricated using thin films using either damascene or subtractive techniques; however, such resistors consume valuable space in an integrated circuit design. Further, bulky resistor structures reduce the amount of available space for more important interconnect structures, for example, metal wires, and other circuit components in the circuit.

The present invention generally relates to semiconductor structures, and more particularly to a horizontal resistor structure. More specifically, the horizontal resistor structures disclosed herein include two or more annular metal structures electrically connected in series and embedded in a dielectric layer. The horizontal resistor structures described herein provide improved scaling flexibility because they enable increasing the length of resistor element without increasing overall footprint of the resistor structure. As such, the unique shape of the horizontal resistor structures disclosed herein provide a similar function in a significantly smaller footprint. Exemplary embodiments of horizontal resistor structures are described in detail below by referring to the accompanying drawings in FIGS. 7 to 10. Those skilled in the art will readily appreciate that the detailed description given herein with respect to these figures is for explanatory purposes as the invention extends beyond these limited embodiments.

Referring now to FIGS. 7, 8, 9, and 10 a demonstrative illustration of a structure 200 is shown during an intermediate step of a method of fabricating a resistor structure according to various embodiments of the invention. The resistor structures depicted by the structure 200 include similar features and are fabricated using similar fabrication techniques as described above with respect to the structure 100.

Like above, the structure 200 may include one or more back-end-of-line metallization levels, and more specifically, a metallization level 202. According to at least one embodiment, the metallization level 202 may include a via level or a metal level, as both are well known to persons having ordinary skill in the art. Although the metallization levels disclosed herein would typically be part of the back-end-of-line, embodiments of the present invention explicitly contemplate other locations and arrangements, such as, for example, middle-of-line, wafer backside, wafer frontside, or other known metallization regions. In all cases, the horizontal resistor structure described herein, and represented by the structure 200, will be integral to the electrical wiring system of a final device or package.

According to at least one embodiment, the metallization level 202 is a typical back-end-of-line level and includes a network of conductive lines or vias embedded in a dielectric layer 208. The network of conductive lines or vias form the "wiring" or electrical connections to underlying transistors and devices (not shown). The conductive lines may alternatively be referred to as metal lines, traces, or metal traces.

According to embodiments of the present invention, the metallization level 202 includes electrodes 204 and a resistor element 206 all embedded in a dielectric layer 208, as illustrated. The dielectric layer 208 may be the same or substantially similar to the first and second dielectric layers 104, 108 described above. The electrodes 204 may be the same or substantially similar to the fuse contacts 122 described above.

According to embodiments of the present invention, the resistor element 206 may include any suitable conductive material having sufficient resistivity of any typical semiconductor circuit having a resistor structure. In an embodiment, the resistor element 206 may include tantalum nitride, titanium nitride, tungsten, tungsten nitride, or some combination thereof. In at least one embodiment, the resistor element 206 may have a thickness, ranging from about 5 nm to about 50 nm. Typically, the resistor element 206 may include a single layer; however, in other embodiments, it may include multiple layers of different conductive materials. It is further noted, the resistor element 206 is fabricated similarly to the conductive layer 114 described above.

Figure 9:
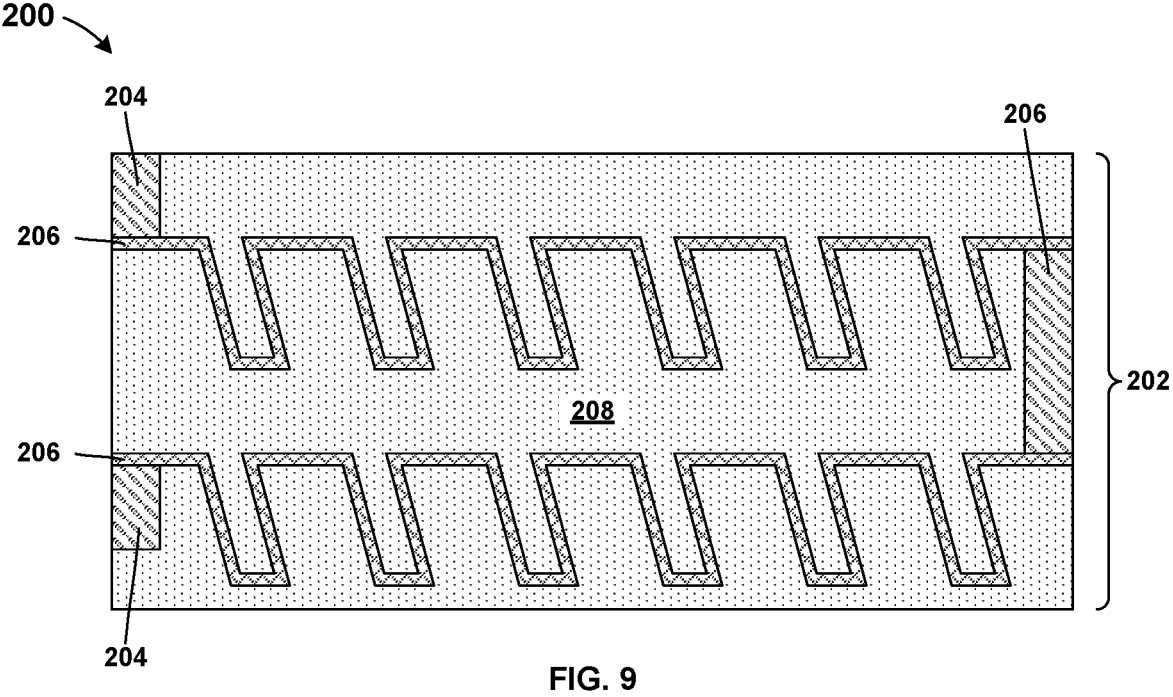
Figure 10:
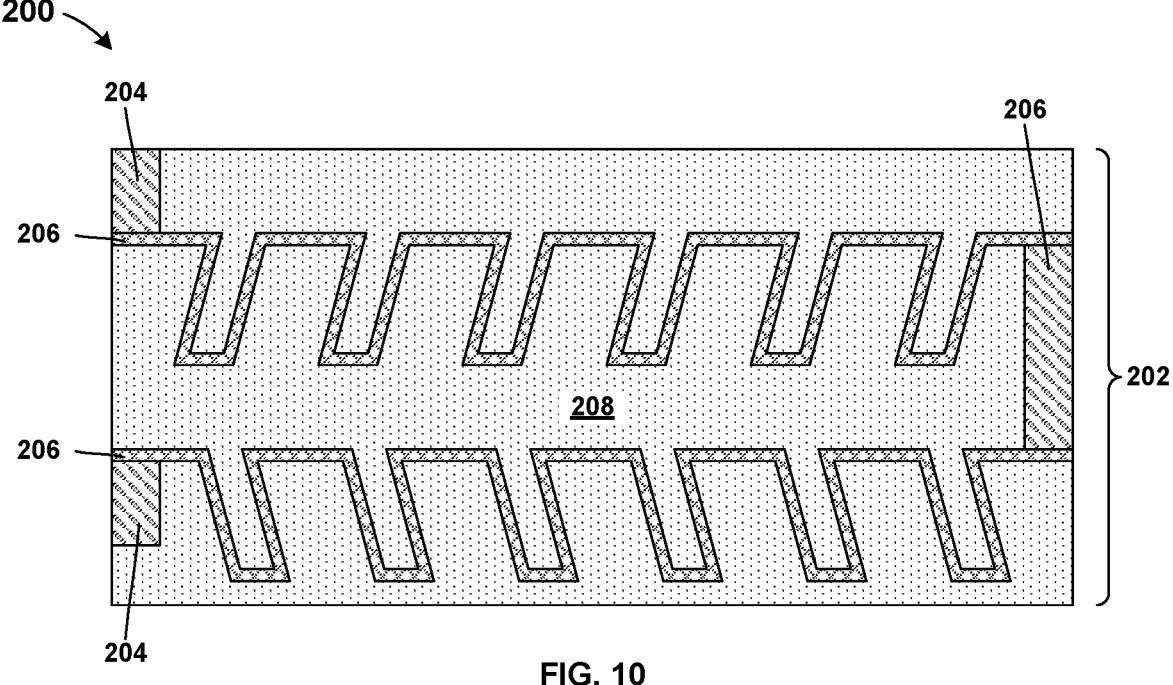

Of note, the resistor element 206 is conformally deposited in angled trenches to form annular metal structures, similar to the conductive layer 114 in the first and second trenches 110, 112 described above. Unlike the conductive layer 114 described above, no polishing techniques are applied to remove excess portions of the resistor element 206. Rather, excess portions of the resistor element 206 must remain on horizontal surfaces to provide electrical continuity between annular metal structures, as illustrated. According to the embodiment illustrated in FIG. 7, all the trenches have a similar angle in the same direction. Meanwhile, the trenches of the embodiment illustrated in FIG. 8 have similar angles in opposite directions much like the structure 100. In yet another embodiment, illustrated in FIG. 9, multiple resistor elements 206 can be stacked to further increase the density of the final resistor structure. Of note, the trenches in FIG. 9 are all pitched at a similar angle in a similar direction. Finally, FIG. 10 illustrates an embodiment having stacked resistor elements 206 with successive layers having trenches pitched in opposite directions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments disclosed herein.

What is claimed is:

1. An antifuse structure comprising:
a fuse dielectric layer; and
two slanted annular metal structures arranged adjacent to and opposite one another, wherein bottom portions of the two slanted annular metal structures are embedded in the fuse dielectric layer.

2. The antifuse structure according to claim 1, further comprising:
a first fuse contact above and directly contacting a top surface of one of the two slanted annular metal structures; and
a second fuse contact above and directly contacting a top surface of another one of the two slanted annular metal structures.

3. The antifuse structure according to claim 1, wherein each of the two slanted annular metal structures is arranged at opposite angles relative to a surface of the fuse dielectric layer.

4. The antifuse structure according to claim 1, wherein each of the two slanted annular metal structures comprises an inner core and an outer shell.

5. The antifuse structure according to claim 1, wherein each of the two slanted annular metal structures comprises an inner core and an outer shell, wherein the inner core comprises a dielectric material and the outer shell comprises a metal layer.

6. The antifuse structure according to claim 1, wherein a first lateral distance between the two slanted annular metal structures measured at a bottom of the two slanted annular metal structures is less than a second lateral distance between the two slanted annular metal structures measured at a top of the two slanted annular metal structures.

7. The antifuse structure according to claim 1, further comprising:
a conductive link in direct contact with and extending between bottoms of the two slanted annular metal structures through the fuse dielectric layer.

8. An antifuse structure comprising:
a fuse dielectric layer;
a top dielectric layer directly on the fuse dielectric layer; and
two slanted annular metal structures arranged adjacent to and opposite one another, wherein only bottom portions of the two slanted annular metal structures are embedded in the fuse dielectric layer.

9. The antifuse structure according to claim 8, further comprising:
a first fuse contact above and directly contacting a top surface of one of the two slanted annular metal structures; and
a second fuse contact above and directly contacting a top surface of another one of the two slanted annular metal structures.

10. The antifuse structure according to claim 8, wherein each of the two slanted annular metal structures is arranged at opposite angles relative to a surface of the fuse dielectric layer.

11. The antifuse structure according to claim 8, wherein each of the two slanted annular metal structures comprises an inner core and an outer shell.

12. The antifuse structure according to claim 8, wherein each of the two slanted annular metal structures comprises an inner core and an outer shell, wherein the inner core comprises a dielectric material and the outer shell comprises a metal layer.

13. The antifuse structure according to claim 8, wherein a first lateral distance between the two slanted annular metal structures measured in the fuse dielectric layer is less than a second lateral distance between the two slanted annular metal structures measured in the top dielectric layer.

14. The antifuse structure according to claim 8, further comprising:
a conductive link in direct contact with and extending between bottoms of the two slanted annular metal structures through the fuse dielectric layer.

15. An antifuse structure comprising:
a fuse dielectric layer;
a top dielectric layer directly on the fuse dielectric layer; and
two slanted annular metal structures arranged adjacent to and opposite one another, wherein only bottom portions of the two slanted annular metal structures are embedded in the fuse dielectric layer, wherein each of the two slanted annular metal structures comprises a metal liner surrounding a bottom and sides of an inner core.

16. The antifuse structure according to claim 15, further comprising:

a first fuse contact above and directly contacting a top surface of one of the two slanted annular metal structures; and a second fuse contact above and directly contacting a top surface of another one of the two slanted annular metal structures.

17. The antifuse structure according to claim 15, wherein each of the two slanted annular metal structures is arranged at opposite angles relative to a surface of the fuse dielectric layer.

18. The antifuse structure according to claim 15, wherein each of the two slanted annular metal structures comprises an inner core, wherein the inner core comprises a dielectric material.

19. The antifuse structure according to claim 15, wherein a first lateral distance between the two slanted annular metal structures measured in the fuse dielectric layer is less than a second lateral distance between the two slanted annular metal structures measured in the top dielectric layer.

20. The antifuse structure according to claim 15, further comprising:

a conductive link in direct contact with and extending through the fuse dielectric layer between the two slanted annular metal structures.

* * * * *